United States Patent [19]

Hodges

[11] Patent Number: 4,665,316

[45] Date of Patent: May 12, 1987

[54] PHOTOVOLTAIC RELAY SWITCH

[75] Inventor: Charles R. Hodges, Sunnyvale, Calif.

[73] Assignee: Telmos Incorporated, Sunnyvale, Calif.

[21] Appl. No.: 673,818

[22] Filed: Nov. 21, 1984

[51] Int. Cl.$^4$ .............................................. G02B 27/00
[52] U.S. Cl. ..................................... 250/551; 307/311
[58] Field of Search ........................... 250/551, 214 R; 307/311

[56] References Cited

U.S. PATENT DOCUMENTS

| | | | |
|---|---|---|---|
| 4,227,098 | 10/1980 | Brown et al. | 307/311 |
| 4,295,058 | 10/1981 | Lade et al. | 307/252 A |
| 4,296,331 | 10/1981 | Rodriguez | 250/511 |
| 4,390,790 | 6/1983 | Rodriguez | 250/551 |
| 4,419,586 | 12/1983 | Phipps | 250/551 |

OTHER PUBLICATIONS

Theta-J Corporation, Data Sheet "OptoMOS, OptoFilm", article entitled, OptoMOS Optically Coupled MOSFET Relays.
Crydom, Data Sheet "The Crydom Photovoltaic Relay (PVR)" and The Crydom BOSFET.
Dionics Inc., Data Sheets, "ISO–GATE Devices," p. 1; DIG-11-06-030, p. 2; DIG-12-06-025, p. 3; and ISO–GATE Device Applications, p. 4.
Dionics Inc. Reprint from *Electronic Design*, Jun. 24, 1982, "Dionics has the Latest Word in Solid State Relay Design".
Dionics Inc., Reprint from *Electronic Products*, Jun. 1982, "Family Includes 'Industry First' Dual-output Devices.".

*Primary Examiner*—Eugene R. LaRoche
*Assistant Examiner*—James C. Lee
*Attorney, Agent, or Firm*—Alan H. MacPherson; Steven F. Caserza; J. Eppa Hite

[57] ABSTRACT

A photovoltaic relay which includes a unique pull down circuit for rapidly turning off the relays field effect transistor(s). The pull down circuit discharges the gate-to-source capacitance of the relay's field effect transistors by turning on a thyristor by turning off a light-activated switch connected between the gate and the cathode terminals of the thyristor. In one integrated circuit embodiment, the light-activated switch is energized by the same light source which activates the photodiode stack which drives the relay. The presence of the pull down circuit does not effect the turn on time of the relay.

13 Claims, 22 Drawing Figures

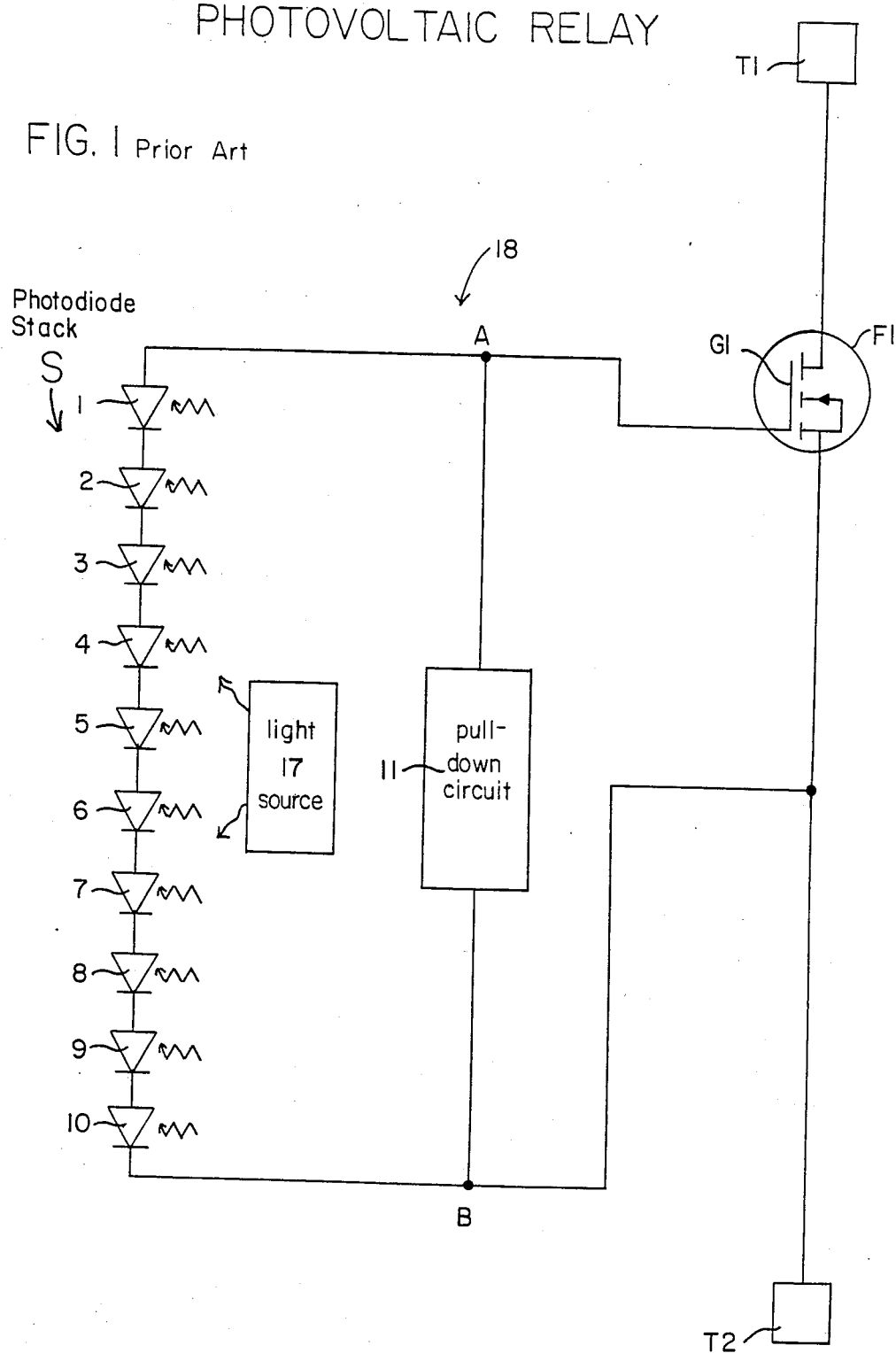

PHOTOVOLTAIC RELAY

FIG. 4 Photovoltaic Relay

ALTERNATE CONFIGURATION
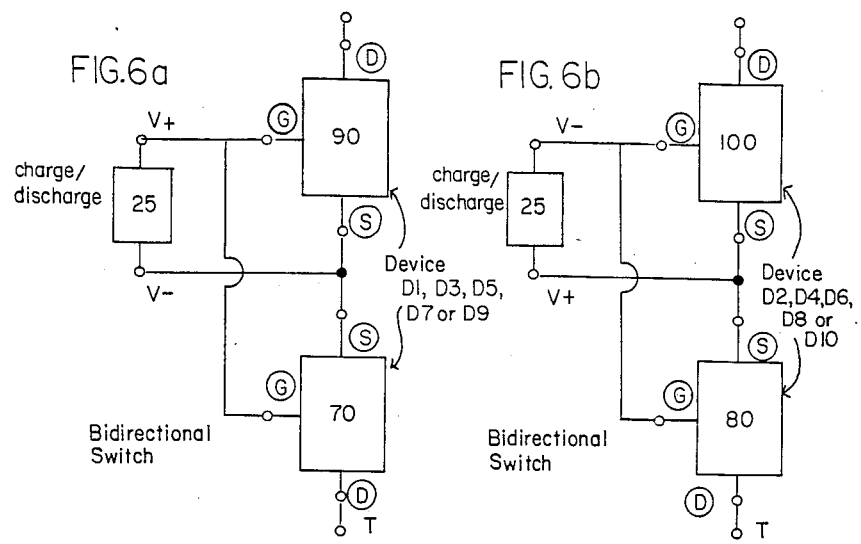
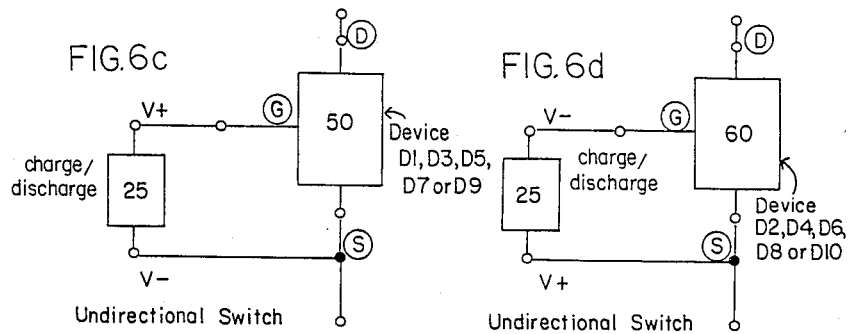
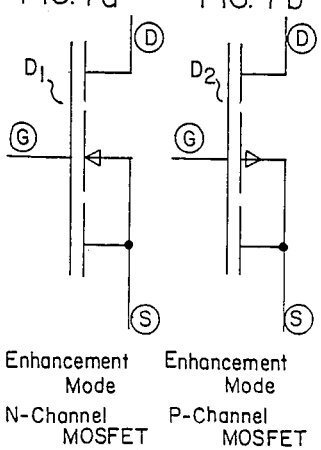
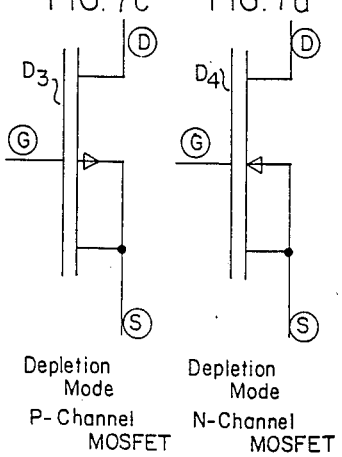

ALTERNATE DEVICES

Depletion Mode
P-Channel JFET

Depletion Mode
N-Channel JFET

Enhancement Mode
N-Channel JFET

Enhancement Mode
P-Channel JFET

Cascode (N-Channels)

Cascode (P-Channels)

PHOTOVOLTAIC RELAY SWITCH

BACKGROUND OF THE INVENTION

1. Field of the Invention

This invention relates to a photovoltaic relay, and in particular to a photovoltaic AC/DC analog switch which includes a unique pull down circuit for rapidly discharging the gate-to-source capacitance (including all parasitic and intrinsic capacitance) of the relay's field effect transistor(s).

2. PRIOR ART

Solid-state relays are rapidly replacing reed relays in many applications. Photovoltaic AC/DC analog switches provide electric isolation comparable to reed relays and also provide superior speed and reliability without "bounce". However, while such switches are faster than reed relays, speed has remained a major problem. In particular, prior art photovoltaic AC/DC switches turn off at a lower speed than desired.

FIG. 1 shows a diagram of a prior art photovoltaic AC/DC analog switch 18, which includes photovoltaic stack S of 10 series-connected photodiodes 1 through 10 connected between the gate and source of N channel field effect transistor (FET) F1. Switch 18 is a unidirectional switch suitable for passing or blocking an electrical current from terminal T1 to terminal T2. When it is desired to turn on switch 18, a light source 17, typically a light-emitting diode (LED), is turned on, and light from light source 17 impinges on the photodiode stack S to generate a photocurrent in each photodiode 1 through 10. This photocurrent flows into the gate G1 of field effect transistor F1, charging the gate-to-source capacitance and causing a gate-to-source voltage drop across F1. However, since the photocurrent generated by each diode is low, typically 1 to 5 microamps, and since the gate capacitance of F1 is large, typically 100 to 400 picofarads, the time required to charge the gate-to-source capacitance is long, approximately 200 to 2000 microseconds. The maximum total voltage across the photodiode stack is the sum of the open circuit voltages of photodiodes 1 through 10. The voltage on the gate of F1 rises asymptotically to this maximum level, which is generally selected to be substantially above the threshold voltage of field effect transistor F1. As a result of the gate-to-source voltage drop across F1, F1 turns on to form a low impedance path from T1 to T2.

When it is desired to turn switch 18 off, light source 17 is turned off, turning off photodiodes 1 through 10. The gate-to-source capacitance of F1 begins to discharge. However, in the absence of pull down circuit 11 connected between node A and node B, the discharge current is only the leakage current of diode stack S, approximately 10 to 1000 picoamps. This makes the turn off time of field effect transistor F1 extremely long, typically 1 to 1000 milliseconds. In order to reduce this lengthy turn off time, various prior art pull down circuits 11 have been connected between nodes A and B.

FIGS. 2a through 2d illustrate various prior art pull down circuits for use with the circuit of FIG. 1. These circuits have been produced by Dionics Inc. of Westbury, N.Y. FIG. 2a shows a pull down circuit 11 consisting of resistor R connected between nodes A and B. By decreasing the resistance of resistor R, the turnoff time of field effect transistor F1 is decreased. Typically, the value of resistor R is selected to be between 1 and 20 megaohms. The circuit of FIG. 2a has the disadvantage that the smaller the value of resistor R, the more current is shunted away from the gate of field effect transistor F1 during turn on, which increases the turn on time.

FIG. 2b shows a pull down circuit 11 including phototransistor 12 connected between nodes A and B which is driven by a separate LED 19. When LED 17 is on, LED 19 is held off by external circuitry (not shown) and thus phototransistor 12 is off. This allows the photocurrent from stack S to charge the gate-to-source capacitance of FET F1, turning F1 on. When LED 17 is turned off, LED 19 is turned on by external circuitry (not shown). Light from LED 19 then turns on phototransistor 12 which discharges photodiode stack S as well as the gate-to-source capacitance of FET F1. FIG. 2c shows a pull down circuit 11 which includes a separate photodiode stack 13 which is driven by LED 14. When LED 17 is turned on, LED 14 is held off by external circuitry (not shown) and thus FET F1 is turned on as explained above. When LED 17 is turned off, LED 14 is turned on (by external circuitry not shown) which causes photodiode stack 13 to draw current and discharge photodiode stack S and the gate-to-source capacitance of FET F1.

FIG. 2d shows a pull down circuit composed of a depletion mode FET 15 with an additional photodiode stack 16 connected between the gate and the source of FET 15. Photodiode stack 16, which may have between 1 and 20 photodiodes, is driven by the same LED 17 as photodiode stack S. When LED 17 is turned on, both stack S and stack 16 are turned on. Stack S charges the gate-to-source capacitance of FET F1, turning on FET F1. Simultaneously, stack 16 charges the gate-to-source capacitance of depletion mode FET 15 which turns off FET 15. When LED 17 is turned off, the voltage across stack 16 drops rapidly since depletion mode FET 15 has a very low gate capacitance. Thus, depletion mode FET 15 turns on, discharging stack S and the gate-to-source capacitance of FET F1.

While the above pull down circuits improve the turn off time of field effect transistor F1, the best turn off time achieved by circuits 2a through 2d is approximately 400 to 800 microseconds, which is still relatively slow. The circuits shown in FIGS. 2b and 2c have the disadvantage of requiring two separate LEDs which are on alternately It is thus very impractical to implement these circuits in a single integrated circuit since stray light from one LED may trigger the device driven by the other LED.

A pull down circuit requiring a separate photodiode stack, e.g., the circuit of FIG. 2c, has the additional disadvantage of a large area penalty in an integrated circuit embodiment.

Therefore, one of the objects of this invention is to provide a photovoltaic relay which includes a pull down circuit for discharging the gate-to-source capacitance of field effect transistor(s) in a photovoltaic relay more rapidly than prior art circuits, without degrading the turn on time of the field effect transistor(s). A further object of the invention is to provide a photovoltaic relay which uses only a single LED and can be implemented as a single-silicon integrated circuit.

SUMMARY

A photovoltaic AC/DC analog switch is provided which includes a photodiode stack, a field effect transistor, and a unique pull down circuit which reduces the turn off time of the switch by an order of magnitude compared to prior art switches. This is accomplished without degrading the turn on time of the switch and without a large area penalty in integrated circuit embodiments.

The pull down circuit includes a thyristor consisting of a PNP and an NPN transistor, and a first and a second phototransistor selectively, connecting terminals of the thyristor. In one embodiment, the second phototransistor provides a low impedance path across the emitter-base junction of the thyristor's PNP transistor when the switch is being turned on, effectively shorting the junction, and the first phototransistor back-biases the emitter-base junction of the thyristor's NPN transistor when the switch is being turned on, which together prevent current from a photodiode stack from flowing through the thyristor when the switch is being turned on by current from the photodiode stack. Thus, the presence of the pull down circuit does not degrade the turn on time of the switch.

In order to turn the switch off, the two phototransistors are turned off. Turning off the second phototransistor permits current due to the charge stored on the gate-to-source capacitance of the field effect transistor to flow into the emitter of the thyristor's PNP transistor by effectively creating a high impedance path between the emitter and the base of the PNP transistor. Turning off the first phototransistor unclamps the base-emitter junction of the thyristor's NPN transistor and puts the base-emitter diode of the NPN transistor in series with the photodiode stack. This allows the discharge current of the gate-to-source capacitance to flow through the photodiode stack and into the base of the NPN transistor, which triggers the thyristor to an "on" state, rapidly discharging the stored charge. The discharge is so rapid that the gate-to-source voltage of the field effect transistor falls below the field effect transistor's threshold voltage in approximately 20 to 30 microseconds, so that the turn off time of the switch is improved by an order of magnitude compared to prior art photovoltaic relays.

The invention will be more fully understood in conjunction with the following drawings and detailed description.

BRIEF DESCRIPTION OF THE DRAWINGS

FIG. 1 shows a prior art photovoltaic relay including pull down circuit 11;

FIGS. 6a and 6b show alternate bidirectional circuit configurations for connection to the V+ and V− terminals of circuit 25 of FIG. 4;

FIGS. 6c and 6d show alternate unidirectional configurations for connection to the V+ and V− terminals of circuit 25 of FIG. 3;

FIGS. 7a through 7j show schematically devices D1 through D10, respectively, which may be substituted for elements 50, 60, 70, 80, 90 and 100 as shown in FIGS. 6a through 6d.

DETAILED DESCRIPTION

Figure 2A:
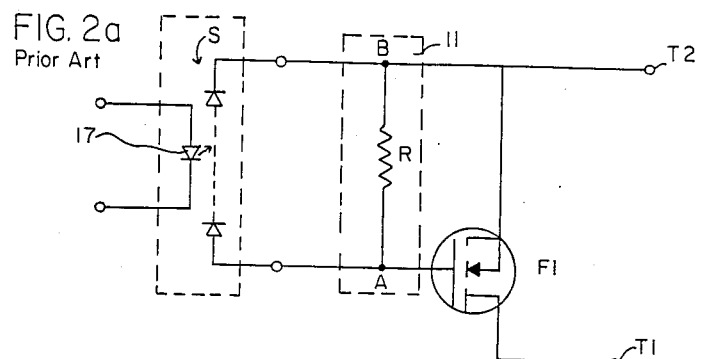
FIGS. 2a through 2d show the prior art photovoltaic relay of FIG. 1 with various prior art pull down circuits.
Figure 2B:
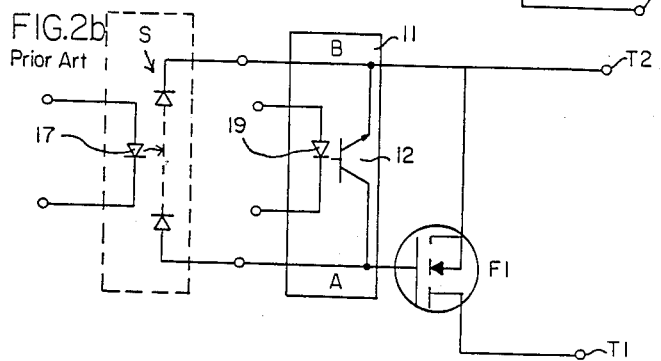
Figure 2C:
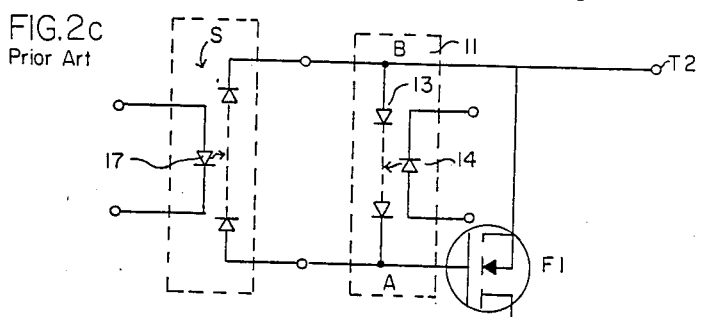
Figure 2D:
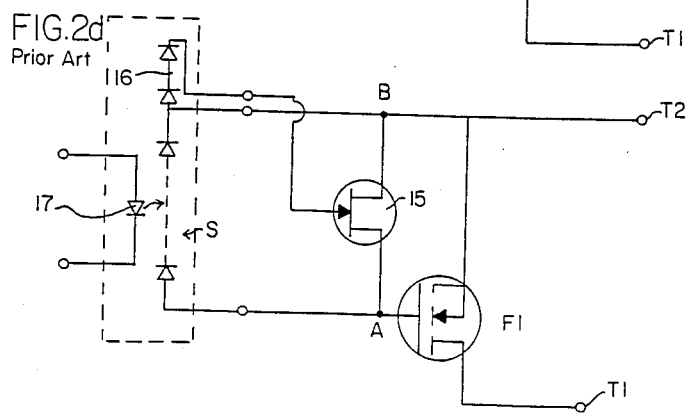
Figure 3:
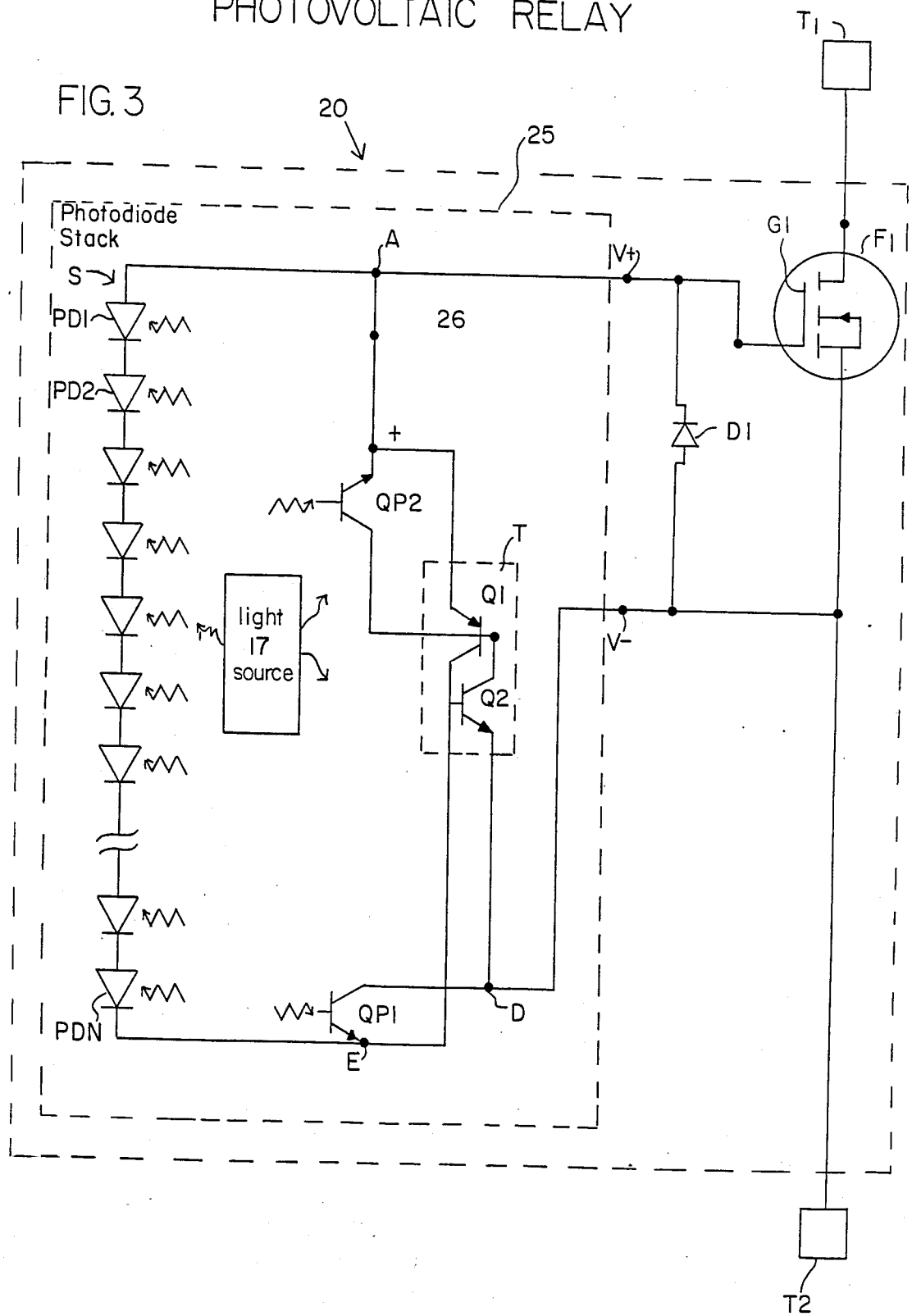
FIG. 3 shows one unidirectional embodiment of the photovoltaic relay of the present invention.

FIG. 3 shows one unidirectional embodiment of the photovoltaic relay circuit 20 of the present invention suitable for passing or blocking a current from terminal T1 to terminal T2.

Photovoltaic relay 20 includes a capacitance charging and discharging circuit 25 formed from a stack S of serially connected photodiodes PD1 through PDN (where N≧2), phototransistors QP1 and QP2, thyristor and a T consisting of PNP transistor Q1 and NPN transistor Q2 interconnected to form a regenerative feedback pair. Relay 20 also includes protection diode D1 and enhancement mode N channel field effect transistor F1. Protection diode D1 serves to prevent destruction of the dielectric beneath gate G1 of FET F1 due to voltage spikes on the gate.

The operation of photovoltaic relay 20 may be understood by considering the following example. Assume as initial conditions that at time $t_0$ no light is shining on photodiodes PD1 through PDN or phototransistors QP1 or QP2, and that the gate to source voltage of F1 is zero volts. Assume that at a later time $t_1$, light from a light-emitting diode (LED) 17 shines on photodiodes PD1 through PDN and on phototransistors QP1 and QP2.

Phototransistor QP2 is a small phototransistor having a response time (turn on time) of approximately two microseconds. It operates in the reverse active mode in order to reduce the Miller capacitance of phototransistor QP2. (A high Miller capacitance would increase the turn on time of power FET F1.) A low $\beta$ transistor, for example a transistor with a $\beta$ in the range of 1 to 20 in the forward active region, is used in another embodiment. Any phototransistor having a turn on time less than approximately 10 microseconds may also be employed.

As phototransistor QP2 turns on, it establishes a low impedance path across the base-emitter junction of transistor Q1 of thyristor T, effectively shorting the junction.

Phototransistor QP1 is also a phototransistor of moderate speed and as it turns on establishes a negative bias across the base emitter junction of transistor Q2 of thyristor T in conjunction with the current flowing into the photodiode stack S. Equivalently, the turning on of phototransistor QP1 back biases the gate (which corresponds to the base of transistor Q2) -to-cathode (which corresponds to the emitter of Q2) terminals of thyristor T.

The light from LED 17 which turns on phototransistors QP1 and QP2 falls simultaneously on the photodiode stack comprising photodiodes PD1 through PDN, and each photodiode begins generating photocurrent. In one embodiment, N is selected to be 10. Steady state is reached as each photodiode reaches its open circuit voltage of approximately 0.5 volts. Approximately 5 volts (less the voltage drop due to transistor QP1) is thus generated across the gate to source of FET F1. While LED 17 is on, thyristor T is held in its off state by the low impedance path provided by phototransistor QP2 and by the negative bias across the base emitter junction of transistor Q2 provided by phototransistor QP1. Since thyristor T is held in its off state while the gate-to-source capacitance of F1 is being charged by the current from photodiode stack S, the presence of the pulldown circuit 26 connected between nodes A, E, and D in circuit 20 does not affect the time required to charge the gate-to-source capacitance. When LED 17 turns on, current flows out of the top of photodiode stack S (node A) into the gate of FET F1, charging the gate-to-source capacitance. This same current must therefore flow out of the source (node D) of F1 and into the collector of phototransistor QP1. It then flows through QP1 and from the emitter of QP1 (node E) back into the photodiode stack S. Since current is flowing from the collector to the emitter of QP1, the voltage at node D must be greater than the voltage at node E which ensures that the base-emitter junction of transistor Q2 of thyristor T is reverse biased. The time required to charge the gate-to-source capacitance of transistor F1 is governed by the equation $I=C*(dv/dt)$, where I is the current generated by photodiode stack S, C is the capacitance of the gate-to-source capacitor of F1 and dv/dt is the time rate of change of the gate to source voltage of transistor F1. Since the current generated by the photodiodes PD1 through PDN is generally very low (typically 2 to 5 microamps) and the gate capacitance of FET F1 is relatively large (typically 100 to 400 picofarads), the time required to charge the gate capacitance is relatively large (typically 200 to 800 $\mu s$), but it is not degraded by the presence of the pulldown circuit. When charged, the gate-to-source voltage of FET F1 of approximately 5 volts enables current to flow from terminal T1 to terminal T2.

Next, assume that it is desired to terminate the passage of current from terminal T1 to terminal T2. LED 17 is turned off, which in turn causes photodiode PD1 through PDN and phototransistors QP2 and QP1 to turn off. The charge stored on the gate of FET F1 begins discharging through the photodiode stack S. As phototransistor QP1 turns off (in 5–20 $\mu sec$), current begins flowing into the base-emitter junction of transistor Q2 of thyristor T. This causes an immediate redistribution of charge by increasing the number of series connected diodes in the circuit from N to N+1, by the addition of the base-emitter junction of transistor Q2, which decreases the current somewhat. Thus turning off phototransistor QP1 allows the base-emitter junction of transistor Q2 of thyristor T to become forward biased. When phototransistor QP2 turns off, it becomes a high impedance path connected in parallel with the base-emitter junction of transistor Q1. Thus effectively no current flows through phototransistor QP2 and the current due to the charge stored on the gate-to-source capacitance of FET F1 flows into the emitter of PNP transistor Q1 and the emitter-base junction of transistor Q1 becomes forward biased. Thyristor T then turns on since the base-emitter junction of transistor Q2 and the base-emitter junction of transistor Q1 become forward biased and a substantial base current (approximately 100 nA) is flowing into the base of transistor Q2 from the discharging of the gate-to-source capacitance through the stack S. When thyristor T turns on, it draws milliamps of current essentially instantaneously and the gate-to-source voltage of FET F1 is pulled down to about 0.6 volts in less than a microsecond. Since the threshold voltage of F1 is greater than 0.7 volts, F1 turns off. The total elapsed time from the time LED 17 is turned off to the turn off of F1 is less than 30 microseconds, which is approximately an order of magnitude less than prior art circuits. In another embodiment (not shown), phototransistor QP2 is omitted and the emitter of transistor Q1 is connected directly to node A. This embodiment also provides a rapid turn off time, but the turn on time of FET F1 is somewhat degraded, so that it is preferable to include transistor QP2.

Figure 4:
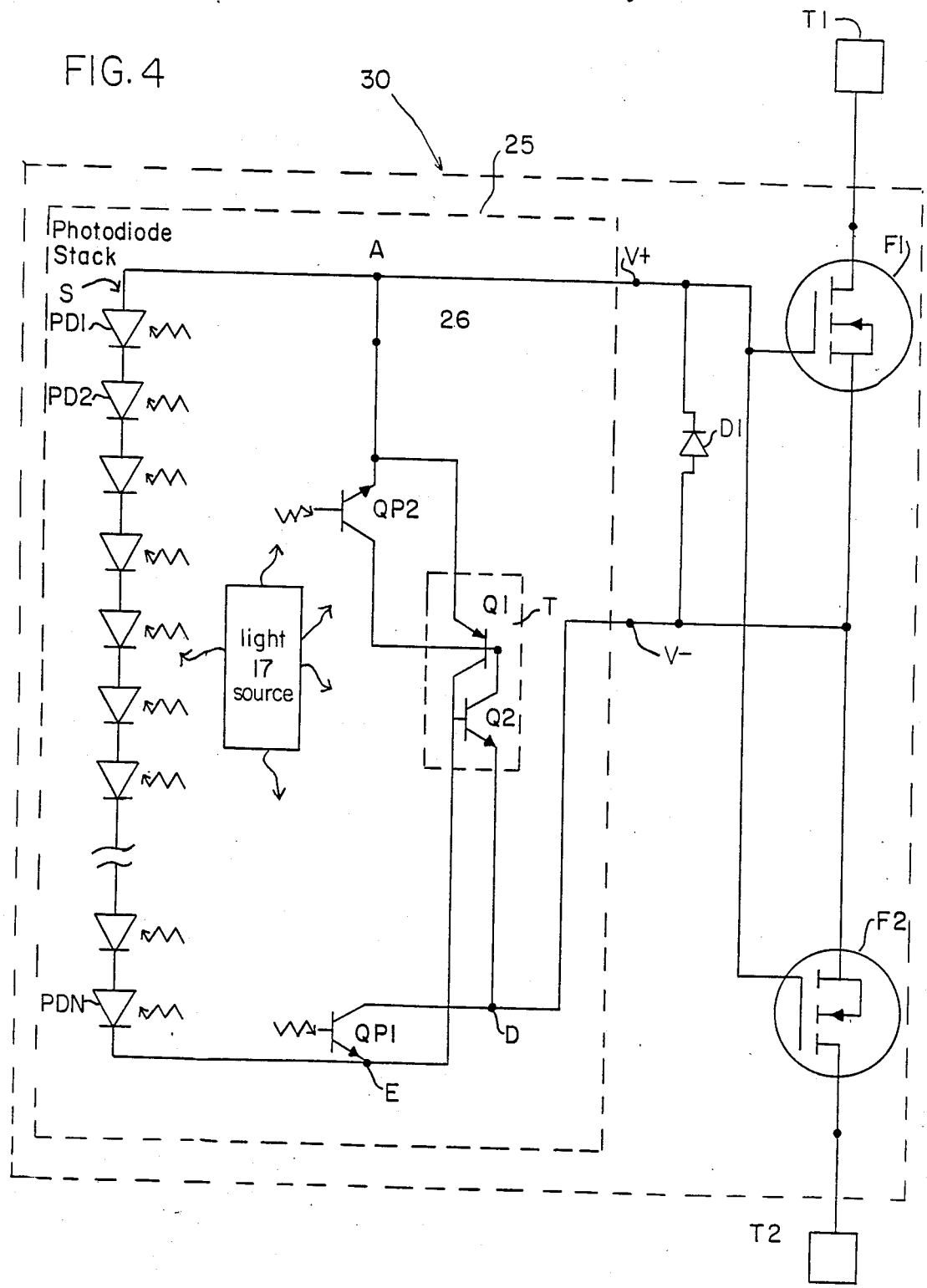
FIG. 4 shows one bidirectional embodiment of the photovoltaic relay of the present invention.

FIG. 4 shows a second embodiment of the photovoltaic relay of my invention. Circuit 30 shown in FIG. 4 is similar to circuit 20 shown in FIG. 3 except that circuit 30 includes a second enhancement mode N channel field effect transistor F2 connected in series with F1 between terminal T1 and terminal T2. Circuit 30 is a bidirectional photovoltaic relay suitable for passing or blocking a current from terminal T1 to terminal T2 or from terminal T2 to terminal T1. In principle, the operation of circuit 30 is the same as circuit 20. When LED 17 is on, the current generated by the photodiode stack charges the gate-to-source capacitance of both transistor F1 and transistor F2, turning F1 and F2 on when the gate-to-source voltage of F1 and F2 exceeds the threshold voltage of F1 and F2. When the LED is turned off, both capacitors discharge rapidly through thyristor T as previously explained.

Figure 5:
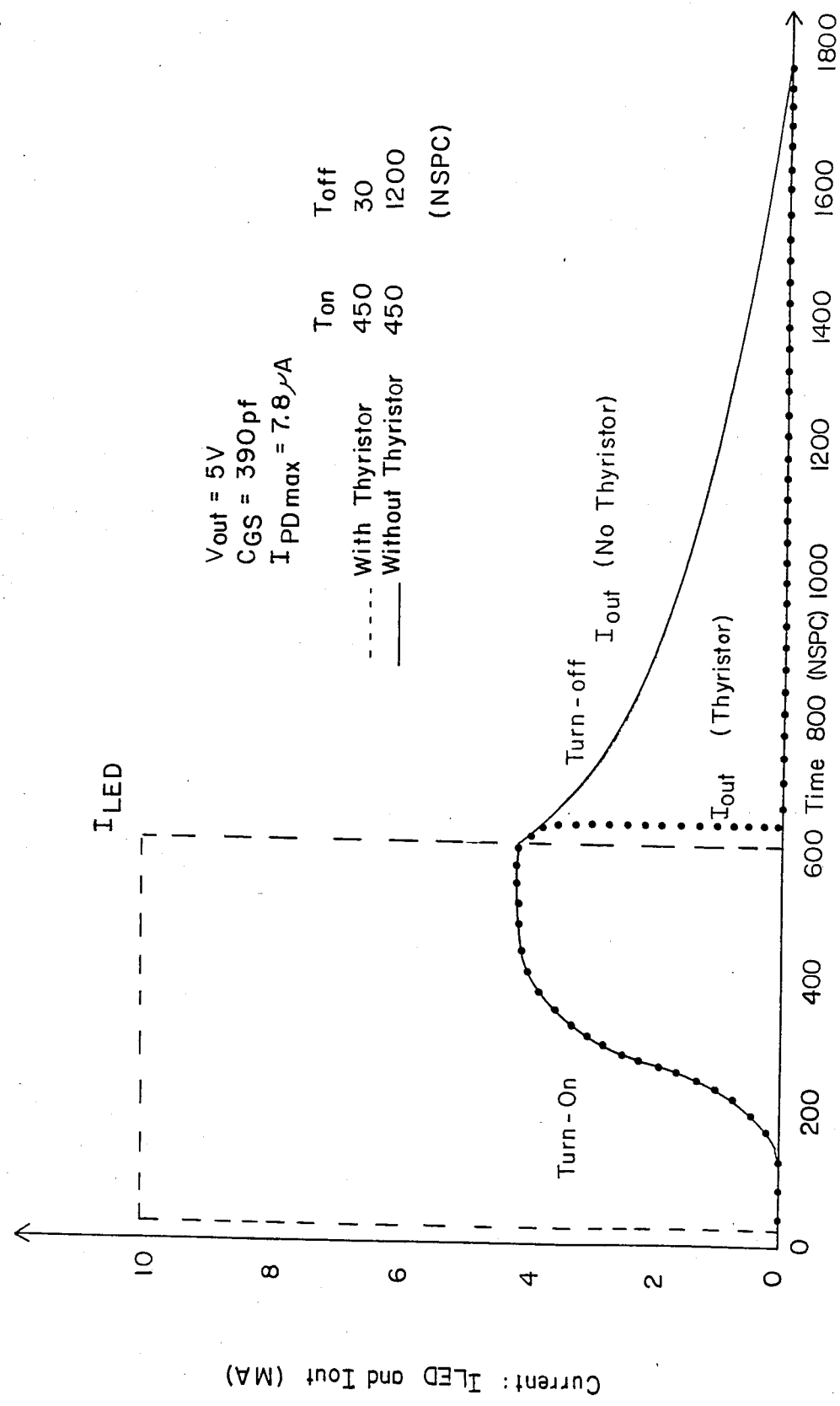
FIG. 5 shows a graph of the performance of the circuit of FIG. 4 versus the performance of the circuit of FIG. 4 without the pull down circuit 26 of FIG. 4.

FIG. 5 illustrates the performance of a breadboard embodiment of circuit 30 (the dotted line shows the performance of circuit 30, the solid line shows the performance of circuit 30 modified by removing the pulldown circuit connected between nodes A, D, and E). In the breadboard embodiment, the photodiodes from nine optocouplers were connected in series to form the current generating stack. An optocoupler was also used for each phototransistor QP2 and QP1. Discrete low voltage FETs were used in place of high voltage FETs F1 and F2 and a discrete thyristor T was used. A capacitor was added in parallel with the to the gate and the source to increase the total gate-to-source capacitance to 390 pf. The maximum current provided by the optocoupler stack is approximately 7.8 microamps and the steady state gate-to-source voltage when F1 and F2 are turned on is 5 volts. This steady state voltage is achieved in 450 milliseconds and this time is independent of the presence or absence of the pulldown circuit. Thus, the pulldown circuit does not degrade the steady state turn on time. The turn off time of F1 and F2 is dramatically improved by the thyristor pull down circuit shown in FIG. 4. The gate to-source voltage of transistors F1 and F2 drops to zero in approximately 30 microseconds, as shown by $I_{out}$, the current flowing out of the gate of transistor F1, falling to zero amps in approximately 20 to 30 microseconds. This is an order of magnitude faster than prior art circuits.

The turn off time is not sensitive to the gate-to-source capacitance, being essentially constant from 100 to 400 pf. The total gate-to-source capacitance of an integrated circuit embodiment of circuit 30 is approximately 120 pf. Moreover, varying the node capacitances on the pull down circuit also had no effect on performance, nor did changing the photocurrents in phototransistor QP2 and QP1 from 2 to 10 microamps. The gain of phototransistor QP2 and QP1 is more important. With a low beta (1–20), transistor QP2 can be used in the active or inverse mode. The beta of transistor QP1 is preferably in the range 50 to 250.

Figure 7G:
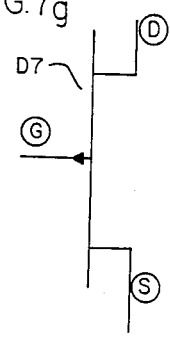
Figure 7H:
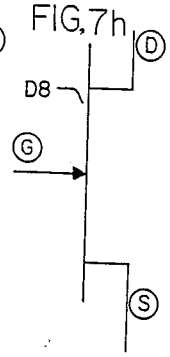
Figure 7I:
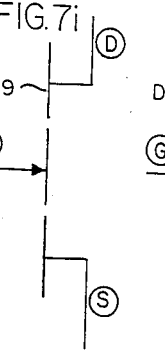
Figure 7J:
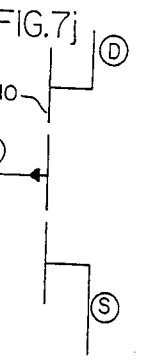
Figure 7E:
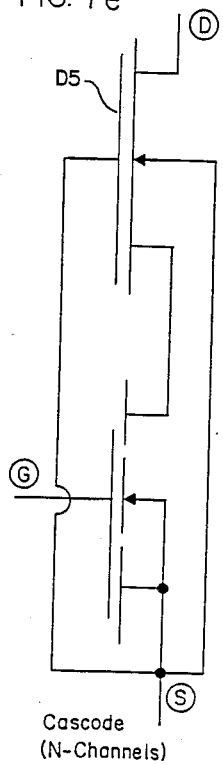

FIGS. 6a and 6b show schematically alternate, bidirectional circuit configurations for connection to terminals V+ and V− of capacitance charging and discharging circuit 25 of FIG. 4. Circuit elements 70 and 90 of FIG. 6a, each having a gate G, a source S, and a drain D, are selected from among the following devices: D1, an enhancement mode N channel MOSFET as shown in FIG. 7a; D3, a depletion mode P channel MOSFET as shown in FIG. 7c; D5, a cascade having N type channels as shown in FIG. 7e; D7, a depletion mode P channel JFET as shown in FIG. 7g; or D9, an enhancement mode N channel junction field effect transistor (JFET) as shown in FIG. 7i. When source 17 light prevents thyristor T from conducting, the circuit 25 V+ and V− voltage difference causes conduction through enhancement mode N channel devices D1, D5, or D9, or prevents conduction through depletion mode P channel device D3 or D7. When thyristor T conducts, terminals V+ and V− are practically shorted and prevent conduction through enhancement mode N channel devices, or allow conduction through depletion mode devices.

Figure 7F:
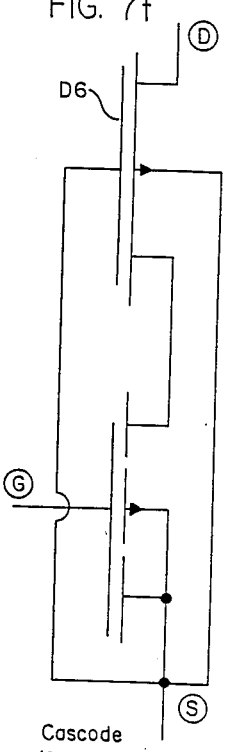

The above-mentioned devices can be replaced by a device controlled by a gate voltage V− equal to or less than its source voltage V+, such as circuit elements 80 and 100 of the bidirectional switch of FIG. 6b, which are selected from among the following devices: D2, an enhancement mode P channel MOSFET as shown in FIG. 7b; D4, a depletion mode N channel MOSFET as shown in FIG. 7d; D6, a cascode having P type channels as shown in FIG. 7f; D8, a depletion mode N channel JFET as shown in FIG. 7h; or D10, an enhancement mode P channel JFET as shown in FIG. 7j. When thyristor T shorts circuit 25 terminals V+ and V−, a depletion mode N channel device (D4, D8) is on, or an enhancement mode P channel device (D2, D6, D10) is off. When thyristor T is not conducting, the terminal V− negative voltage turns on an enhancement P channel device (D2, D6, D10) or turns off a depletion N channel (D4, D8).

FIGS. 6c and 6d show schematically alternate unidirectional configurations for connection to terminals V+ and V− of circuit 25 of FIG. 3. Circuit element 50 of FIG. 6c having a gate G, a source S, and a drain D, is selected from among the devices D1, D3, D5, D7 and D9 described above. Circuit element 60 of FIG. 6d having gate G, source S and Drain D is selected from among the devices D2, D4, D6, D8, and D10 described above.

In all of the above embodiments, the number of diodes in the photodiode stack S shown in circuit 25 of FIGS. 3 and 4 is typically between 4 and 20.

Circuit 25 may also be used to charge or discharge a capacitance which is part of a semiconductor circuit other than the gate-to-source capacitance of a field effect transistor, for example the capacitance across two diodes connected in series.

The above embodiments are meant to be exemplary and not limiting and in view of the above disclosure, many substitutions and modifications will be apparent to one of average skill in the art without departing from the scope of the invention.

I claim:

1. A device for charging and discharging a capacitance which is part of a semiconductor circuit, said capacitance having a first lead and a second lead, said device comprising:
    a stack of two or more series-connected photodiodes having a first lead connected to said first lead of said capacitance and having a second lead;
    a pull down circuit comprising a thyristor and a first light-activated switch having a first state and a second state, said thyristor having a first lead connected to said first lead of said stack, a second lead connected to said second lead of said stack, and a third lead connected to said second lead of said capacitance, said first light-activated switch being connected between said second and said third leads of said thyristor, wherein said first light-activated switch maintains said thyristor in an "off" state when said switch is in said first state, and permits said thyristor to turn on in order to discharge said capacitance when said first light-activated switch is in said second state.

2. A device as in claim 1 wherein said thyristor comprises a PNP and an NPN transistor, each having a base, an emitter and a collector, said first lead of said thyristor being connected to said emitter of said PNP transistor, said second lead of said thyristor being connected to said base of said NPN transistor, said third lead of said thyristor being connected to said emitter of said NPN transistor.

3. A device as in claim 2 wherein said first light-activated switch comprises a phototransistor having an emitter, a base and a collector, said emitter of said phototransistor being connected to said base of said NPN transistor, said collector of said phototransistor being connected to said emitter of said NPN transistor.

4. A device as in claim 2 further comprising a second light-activated switch having a first state and a second state connected between said base and said emitter of said PNP transistor, wherein said second light-activated switch provides a low impedance path between said base and said emitter of said PNP transistor when said second light-activated switch is in said first state and provides a high impedance path between said base and said emitter of said PNP transistor when said second light-activated switch is in said second state.

5. A device as in claim 3 further comprising a second light-activated switch, having a first state and a second state connected between said base and said collector of said PNP transistor, wherein said second light-activated switch provides a low impedance path between said base and said emitter of said PNP transistor when said second light-activated switch is in said first state and provides a high impedance path between said base and said emitter of said PNP transistor when said second light-activated switch is in said second state.

6. A device as in claim 4 wherein said second light-activated switch comprises a phototransistor having a base, an emitter and a collector, said emitter of said second phototransistor being connected to said emitter of said PNP transistor, said collector of said second phototransistor being connected to said base of said PNP transistor.

7. A device as in claim 5 wherein said second light-activated switch comprises a phototransistor having a base, an emitter and a collector, said emitter of said second phototransistor being connected to said emitter of said PNP transistor, said collector of said second phototransistor being connected to said base of said PNP transistor.

8. A device as in claim 1, 2, 3, 4, 5, 6 or 7 wherein said capacitance comprises the gate-to-source capacitance of one or more field effect transistors.

9. A device as in claim 8, further including a single light source for activating said stack of two or more series-connected photodiodes and all of said light-activated switches.

10. A photovoltaic relay comprising:
    at least one field effect transistor having a gate control lead, a source control lead, and a drain lead;
    a stack of two or more series-connected photodiodes having a first lead and a second lead;

a pull down circuit comprising a thyristor and a first light-activated switch having a first state and a second state, said thyristor having a first lead connected to said first lead of said stack, a second lead connected to said second lead of said stack, and a third lead, said first light-activated switch being connected between said second and said third leads of said thyristor, wherein said first lead of said stack is connected to a first one of said control leads, and said third lead of said thyristor is connected to the second one of said control leads, and wherein said first light-activated switch maintains said thyristor in an off state when said switch is in said first state and permits said thyristor to turn on in order to discharge the gate-to-source capacitance of said field effect transistor when said first light activated switch is in said second state.

11. A circuit of the type for charging and discharging a capacitance between two biasing leads, characterized in that said circuit comprises:

a capacitance charging diode stack, including a series of at least two photosensitive diodes, and ending in anode and cathode leads; and a capacitance discharging circuit including a thyristor having anode and cathode current leads each connected to a respective one of said biasing leads, a first polarity one of said current leads also being coupled to the first polarity lead of the diode stack, said thyristor also having a base trigger lead which is connected to the second polarity lead of the diode stack, and a photosensitive switch connected between said base trigger lead and the second polarity current lead.

12. A circuit as in claim 11 further characterized in that said thyristor includes a second base trigger lead, and in that the discharging circuit includes a second photosensitive switch connected between the second base trigger lead and the first polarity current lead.

13. A circuit as in claim 12 further characterized in that the first polarity current lead is coupled by a direct connection to the first polarity of the diode stack.

* * * * *